United States Patent
Yokoyama

(10) Patent No.: US 8,173,464 B2
(45) Date of Patent: May 8, 2012

(54) METHOD FOR FABRICATING SEMICONDUCTOR DEVICE

(75) Inventor: Mitsunori Yokoyama, Kanagawa (JP)

(73) Assignee: Sumitomo Electric Device Innovations, Inc., Yokohama, Kanagawa (JP)

( * ) Notice: Subject to any disclaimer, the term of this patent is extended or adjusted under 35 U.S.C. 154(b) by 208 days.

(21) Appl. No.: 12/727,809

(22) Filed: Mar. 19, 2010

(65) Prior Publication Data

US 2010/0240198 A1 Sep. 23, 2010

(30) Foreign Application Priority Data

Mar. 23, 2009 (JP) ................................. 2009-069304

(51) Int. Cl.
*H01L 21/00* (2006.01)

(52) U.S. Cl. .................................. 438/46; 257/E21.09

(58) Field of Classification Search .................... 438/46, 438/47, 93, 94, 779; 257/98, 103, E21.09; 427/255.394
See application file for complete search history.

(56) References Cited

U.S. PATENT DOCUMENTS

| | | | |
|---|---|---|---|
| 2002/0155712 A1* | 10/2002 | Urashima et al. | ............ 438/689 |
| 2004/0247947 A1 | 12/2004 | Asai et al. | |
| 2006/0286782 A1* | 12/2006 | Gaska et al. | ................. 438/483 |
| 2007/0141823 A1 | 6/2007 | Preble et al. | |

FOREIGN PATENT DOCUMENTS

| | | |
|---|---|---|
| EP | 1065705 A2 | 1/2001 |
| JP | 2000-277441 A | 10/2000 |

OTHER PUBLICATIONS

European Search Report dated Jun. 9, 2011, issued in corresponding European Patent Application No. 10157414.3.
Chen P et al.; "Growth of high quality GaN layer with AlN buffer on Si(1 1 1) substrates"; Journal of Crystal Growth, vol. 225, May 2011 (May 2001), pp. 150-154, XP002639162.

* cited by examiner

*Primary Examiner* — Brook Kebede
(74) *Attorney, Agent, or Firm* — Westerman, Hattori, Daniels & Adrian, LLP

(57) ABSTRACT

A method for fabricating a semiconductor device includes growing an AlN layer by MOVPE in which a nitrogen-source flow ratio at a far side from a substrate is set lower than that at a near side, the nitrogen-source flow ratio being a ratio of a flow rate of a nitrogen source to a total flow rate of growth gas; and growing a GaN-based semiconductor layer on the AlN layer by MOVPE.

10 Claims, 6 Drawing Sheets

METHOD FOR FABRICATING SEMICONDUCTOR DEVICE

CROSS-REFERENCE TO RELATED APPLICATION

This application is based upon and claims the benefit of priority of the prior Japanese Patent Application No. 2009-069304, filed on Mar. 23, 2009, the entire contents of which are incorporated herein by reference.

BACKGROUND (i) Technical Field

The present invention relates to a method for fabricating a semiconductor device.

(ii) Related Art

Field effect transistors (FETs) using a GaN-based semiconductor layer are used as power devices capable of operating at high frequencies and outputting high power, light-emitting diodes, and laser diodes capable of emitting light of short wavelengths. There has been considerable activity in the development of semiconductor devices suitable for amplifying in high-frequency bands, which may include microwaves, quasi-millimeter waves, or millimeter waves. Examples of these semiconductor devices are FETs such as high electron mobility transistors (HEMT), and laser diodes such as vertical cavity semiconductor surface emitting lasers (VCSEL).

The GaN-based semiconductor is a semiconductor containing GaN, and is, for example, GaN, AlGaN that is a mixed crystal of GaN and AlN, InGaN that is a mixed crystal of GaN and InN, and AlInGaN that is a mixed crystal of GaN, AlN and InN.

Japanese Patent Application Publication No. 2000-277441 discloses a semiconductor device and a crystal growing method directed to improving performance and reliability by growing an AlN layer on a Si substrate and growing an AlGaN layer on the AlN layer.

SUMMARY OF INVENTION

It is an object of the present invention to improve surface morphology and crystal quality of semiconductor device.

According to an aspect of the present invention, there is provided a method for fabricating a semiconductor device including: growing an AlN layer by MOVPE in which a nitrogen-source flow ratio at a far side from a substrate is set lower than that at a near side, the nitrogen-source flow ratio being a ratio of a flow rate of a nitrogen source to a total flow rate of growth gas; and growing a GaN-based semiconductor layer on the AlN layer by MOVPE.

DETAILED DESCRIPTION

In the method proposed in the aforementioned application publication, the surface morphology and crystal quality may be degraded in the process of growing the AlN layer on the substrate. Particularly, in a case where the AlN layer is formed on the Si substrate, the interface between the substrate and the grown layer is caused to have a reduced resistance. In HEMT or the like, the reduced resistance of the interface may degrade the breakdown voltage or the high-frequency performance. According to an aspect of an embodiment, the above problems are solved.

Now, a description will be given of a comparative example to be compared with an embodiment.

Figure 1:
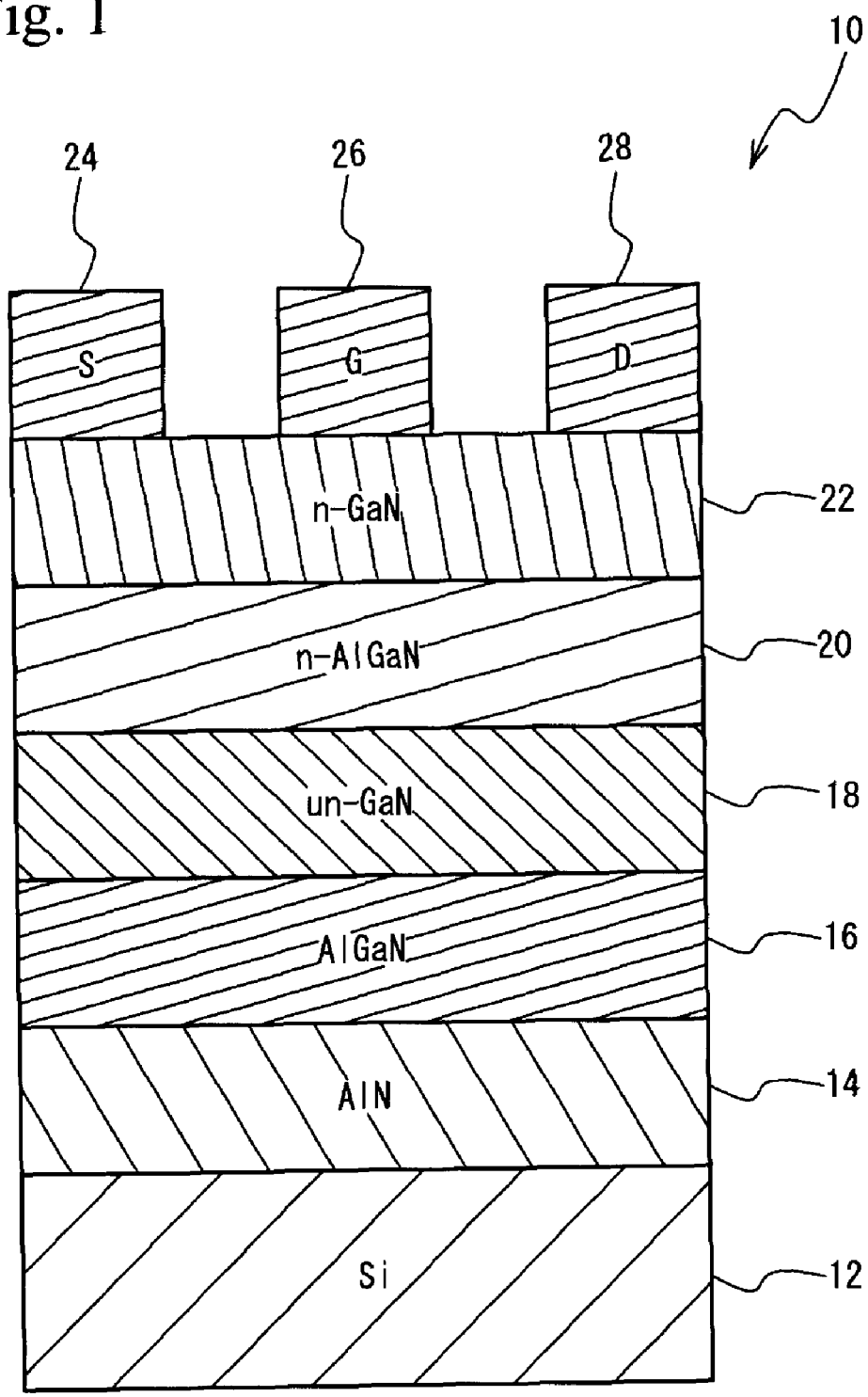
FIG. 1 is a cross-sectional view of a semiconductor device in accordance with a first comparative example.

FIG. 1 is a cross-sectional view of a semiconductor device 10 in accordance with a first comparative example. Referring to FIG. 1, layers 14, 16, 18, 20, 22, 24, 26 and 28 are sequentially formed on a Si substrate 12 by MOVPE (Metal Organic Vapor Phase Epitaxy). The layer 14 is an AlN layer, and the layer 16 is an aluminum gallium nitride (AlGaN) layer. The layer 18 is an undoped gallium nitride (un-GaN) layer, and the layer 20 is an n-type aluminum gallium nitride (n-AlGAN) layer 20. The layer 22 is an n-type gallium nitride (n-GaN) layer 22. The layers 24, 26 and 28 are respectively a source electrode, a gate electrode, and a drain electrode.

In the first comparative example, the AlN layer 14 will have a rugged surface in a case where the AlN layer 14 is grown at an increased ratio of the flow rate of a nitrogen source (source materials of nitrogen) to the total flow rate of growth gas. In the following, the above ratio will be referred to as nitrogen-source flow ratio. Increased ruggedness of the AlN layer 14 deteriorates the surface morphology. Even when the AlN layer 14 is grown up to a thickness of about 300 nm to 400 nm, the surface ruggedness is not improved. This is because there is a high possibility that nitrogen face growth may take place in the AlN layer 14. When the ruggedness of the surface of the AlN layer 14 increases in the process of growing the AlN layer 14, the GaN-based semiconductor layer formed on the AlN layer 14 may have an increased ruggedness. When the nitrogen-source flow ratio is decreased, the surface of the AlN layer 14 tends to be made flat, and the AlN layer 14 can be grown with good surface morphology.

However, when a decreased nitrogen-source flow ratio is used in the process of growing the AlN layer 14, the crystal quality deteriorates. The crystalline property is indicted by the full width at half maximum (FWHM) of x-ray rocking curve (XRC). The crystal quality deteriorates and the XRC-FWHM increases when the dislocation density or faulty density increases. In a case where the AlN layer 14 having a bad crystal quality is formed on the Si substrate 12, the sheet resistance is reduced. The reduced sheet resistance may degrade the breakdown voltage and the high-frequency performance of HEMT.

The inventor conducted an experiment directed to solving the above-described problems. The experiment is now described.

Figure 2A:
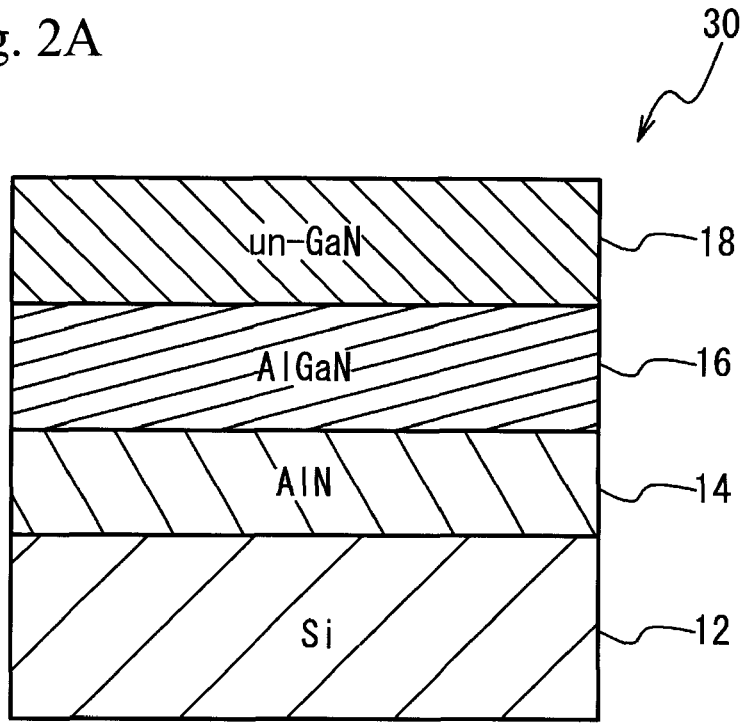
FIGS. 2A and 2B are respectively cross-sectional views of samples used in an experiment.
Figure 2B:
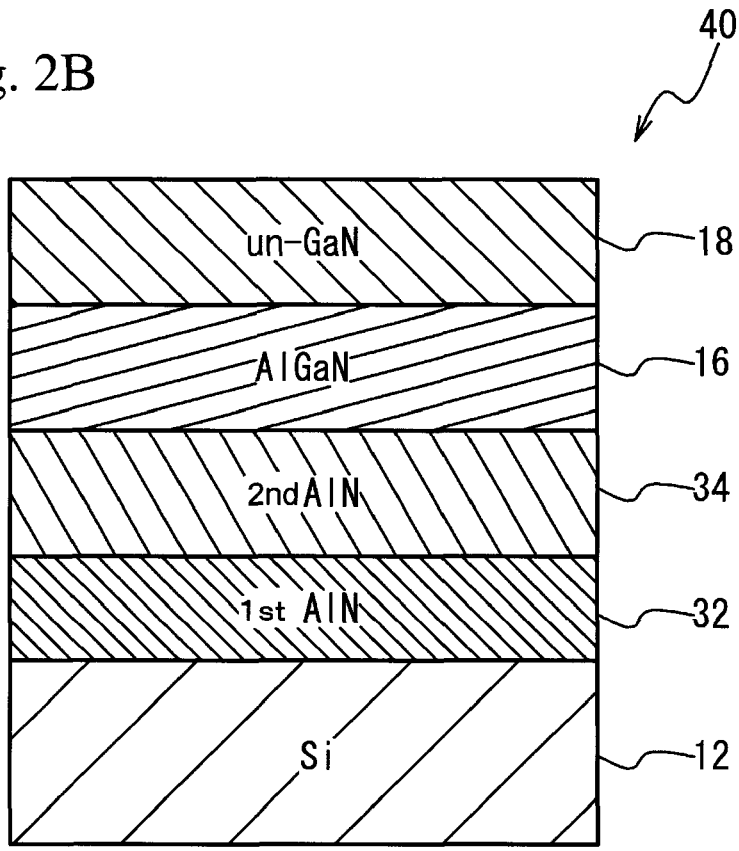

FIGS. 2A and 2B illustrate samples 30 and 40 used in the experiment, respectively. In these figures, parts that are the same as those used in FIG. 1 are given the same reference numerals.

Referring to FIG. 2A, the AlN layer 14 having a thickness of 25 nm is grown on the (111) plane of the Si substrate 12 by MOVPE. The growth condition is as follows:

Flow rate (total flow rate is 10 SLM): 30 μmol/min for TMAl (trimethylaluminum); 0.05 SLM for $NH_3$ (ammonia),
Growth pressure; $1.00 \times 10^4$ Pa,
Growth temperature: 1030° C.

The nitrogen-source flow ratio in the process of growing the AlN layer 14 is 0.005.

The AlGaN layer 16 having a thickness of 250 nm is grown on the AlN layer 14. The growth condition is as follows.

Flow rate (total flow rate is 10 SLM): 30 μmol/min for TMAl; 30 μmol/min for TMGa (trimethylgallium); 5 SLM for $NH_3$ (ammonia),
Growth pressure: $1.33 \times 10^4$ Pa,
Growth temperature: 1030° C.

The undoped GaN layer 18 having a thickness of 1000 nm is grown on the AlGaN layer 16. The growth condition is as follows.

Flow rate: 50 μmol/min for TMGa; 5 SLM for $NH_3$ (ammonia),
Growth pressure: $1.33 \times 10^4$ Pa,
Growth temperature: 1030° C.

The sample 30 is completed through the above processes.

Since the nitrogen-source flow ratio used when the AlN layer 14 is grown is as small as 0.005, the sample 30 has good surface morphology.

Referring to FIG. 2B, the sample 40 differs from the sample 30 in that the AlN layer 14 used in the sample 30 is replaced with a first AlN layer 32, and a second AlN layer 34.

The first AlN layer 32 having a thickness of 20 nm is formed on the Si substrate 12 by MOVPE. The growth condition is as follows.

Flow rate (total flow rate is 10 SLM); 30 μmol/min for TMAl; 5 SLM for $NH_3$ (ammonia),
Growth pressure: $1.00 \times 10^4$ Pa,
Growth temperature: 1030° C.

A first flow ratio, which is the nitrogen-source flow ratio used in the process of growing the first AlN layer 32 is 0.5.

The second AlN layer 34 having a thickness of 230 nm is formed on the first AlN layer 32. The growth condition is as follows.

Flow rate (total flow rate is 10 SLM): 30 μmol/min for TMAl; 0.05 SLM for $NH_3$ (ammonia),
Growth pressure; $1.00 \times 10^4$ Pa,
Growth temperature: 1030° C.

A second flow ratio, which is the nitrogen-source flow ratio used in the process of growing the second AlN layer 34 is 0.005.

The AlGaN layer 16 having a thickness of 250 nm is grown on the second AlN layer 34. The growth condition is as follows.

Flow rate (total flow rate is 10 SLM): 30 μmol/min for TMAl; 30 μmol/min for TMGa; 5 SLM for $NH_3$ (ammonia),
Growth pressure: $1.33 \times 10^4$ Pa,
Growth temperature: 1030° C.

The undoped GaN layer 18 having a thickness of 1000 nm is grown on the AlGaN layer 16. The growth condition is as follows.

Flow rate (total flow rate is 10 SLM): 50 μmol/min for TMGa; 5 SLM for $NH_3$ (ammonia),
Growth pressure: $1.33 \times 10^4$ Pa,
Growth temperature: 1030° C.

The sample 40 is completed through the above processes.

In the sample 40, the second flow ratio is lower than the first flow ratio.

The results of the experiment using the samples 30 and 40 are described below.

Figure 3:
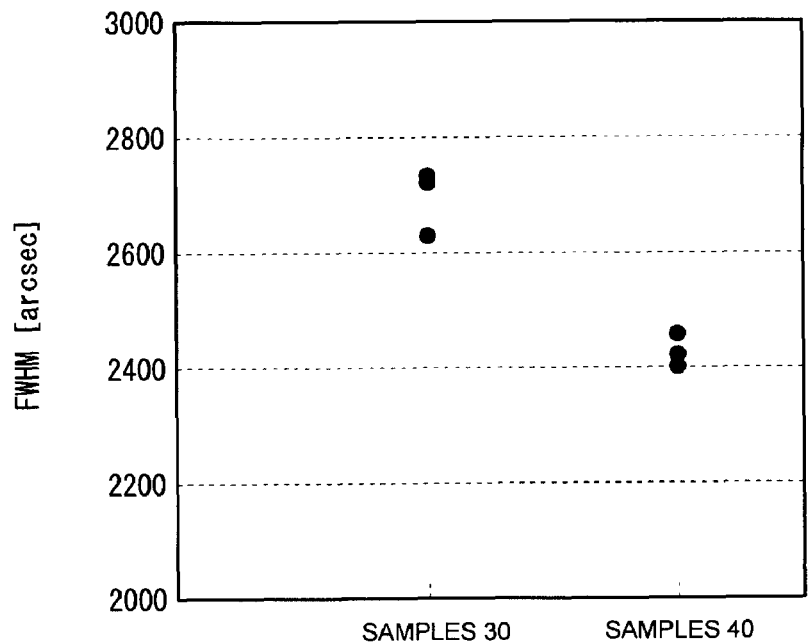
FIG. 3 is a graph of the results of measuring the full width at half maximum of x-ray rocking curve of the samples.

FIG. 3 illustrates the results of measuring the XRC-FWHM of the samples 30 and 40. The left-hand side part of FIG. 3 relates to the samples 30, and the right-hand side part thereof relates to the samples 40. The XRC-FWHM of the samples 40 is narrower than that of the samples 30. This shows that the crystal property of the samples 40 has been improved.

Figure 4:
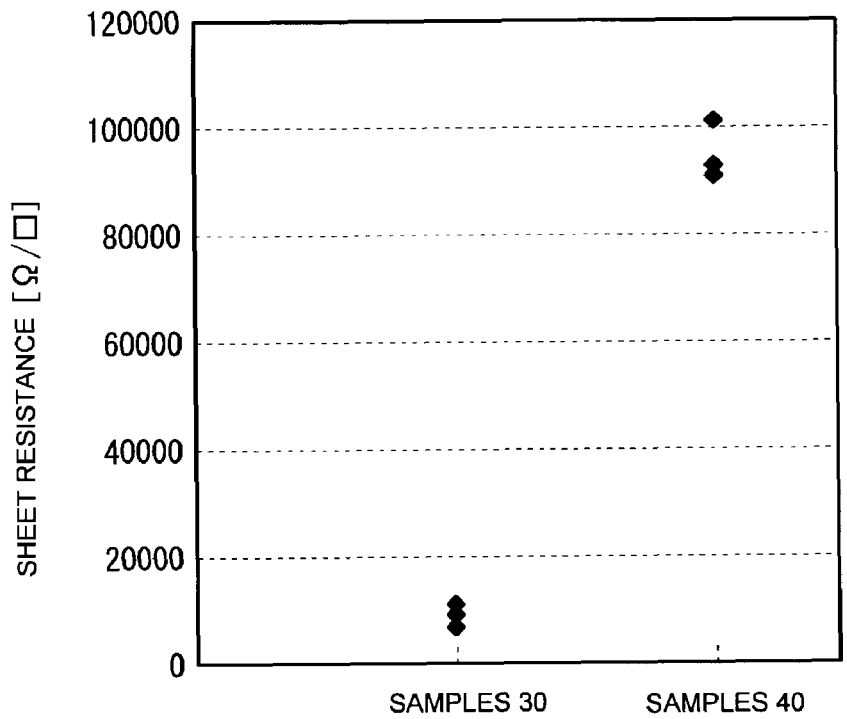
FIG. 4 is a graph of the results of measuring the sheet resistance of the samples.

FIG. 4 shows the results of measuring the sheet resistances of the samples 30 and 40. The sheet resistances of the samples 30 and 40 are those of the whole of the Si substrate 12 and the AlN layer 14 after the AlN layer 14 is formed on the Si substrate 12. The sheet resistance is measured by a non-contacting method using eddy current. Referring to FIG. 4, the sheet resistances of the samples 30 are approximately 15000Ω/□. In contrast, the sheet resistances of the samples 40 are approximately 90000-100000Ω/□. It can be seen from the above that the samples 40 are improved to prevent the sheet resistances from decreasing.

The above results of the experiment conducted by the inventor show the samples 40 have better crystal quality that the samples 30 while having surface morphology as good as that of the samples 30 and realizes high sheet resistance in the structure in which the AlN layer is grown on the Si substrate 12.

First Embodiment

A description will now be given of a first embodiment, which is a method for fabricating a semiconductor device capable of realizing improvement in the crystal quality and increased sheet resistance in growth on the Si substrate without deteriorating the surface morphology.

Figure 5:
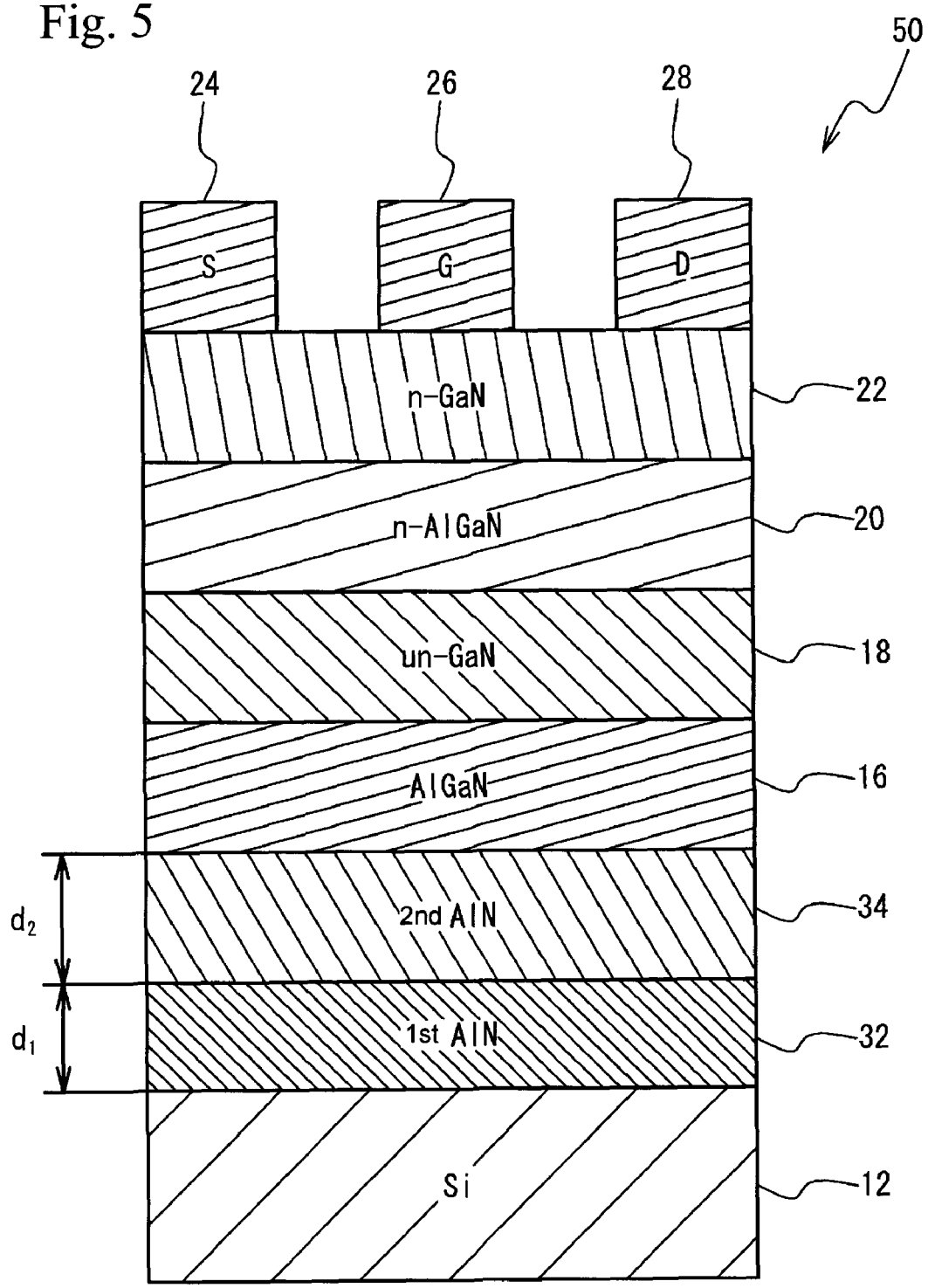
FIG. 5 is a cross-sectional view of a semiconductor device in accordance with a first embodiment.

FIG. 5 is a cross-sectional view of a semiconductor device 50 in accordance with the first embodiment, in which parts that are the same as those illustrated in FIG. 1 are given the same reference numerals. The structure in FIG. 5 differs from that in FIG. 1 in the following.

Referring to FIG. 5, the first AlN layer 32 and the second AlN layer 34 are grown on the Si substrate 12 by reducing the nitrogen-source flow ratio used in growing the AlN layer that is located further away from the Si substrate 12. More particularly, the first AlN layer 32 is formed on the Si substrate 12 by setting the nitrogen-source flow ratio to a first flow ratio. Thereafter, the second AlN layer 34 is formed on the first AlN layer 32 by setting the nitrogen-source flow ratio to a second flow ratio lower than the first flow ratio. The first AlN layer 32 has a thickness d1 less than a thickness d2 of the second AlN layer 34. Then, the undoped GaN layer 18, the n-type AlGaN layer 20 and the n-type GaN layer 22 are sequentially grown on the second AlN layer 34.

The conditions for growing the first AlN layer 32, the second AlN layer 34 and the undoped GaN layer 18 are the same as those described previously.

Figure 6:
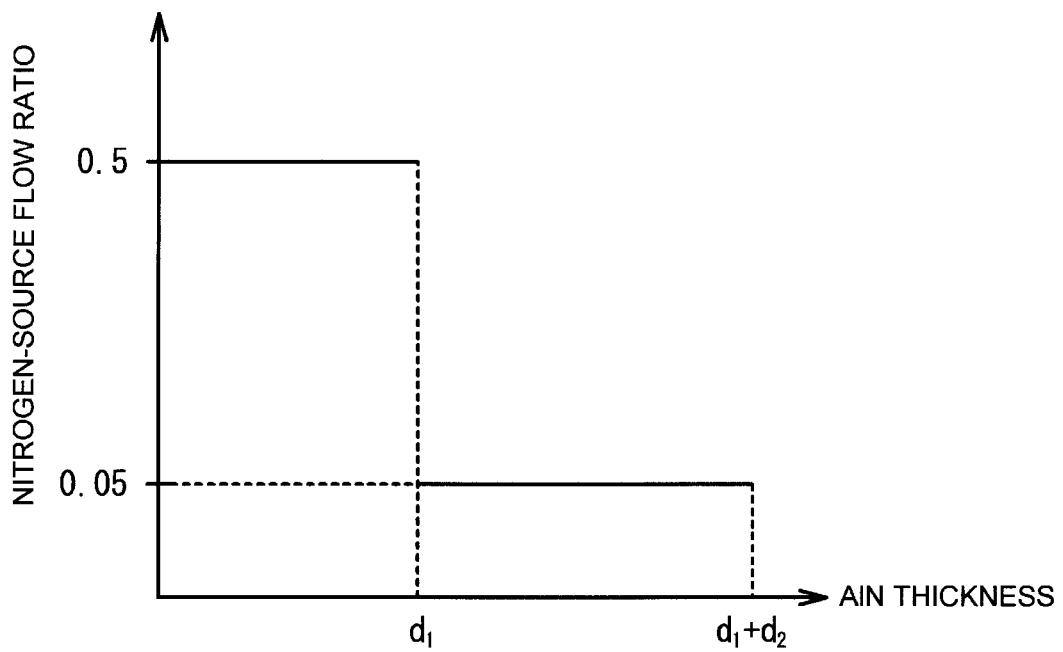
FIG. 6 is a graph that illustrates a change of the nitrogen-source flow ratio in the thickness direction with respect to a change in the thickness of an AlN layer in the first embodiment.

A description is now given of a method for changing the nitrogen-source flow ratio in the processes of growing the first AlN layer 32 and the second AlN layer 34. FIG. 6 is a graph that illustrates a change of the nitrogen-source flow ratio in the thickness direction with respect to a change in the thickness of the first and second AlN layers 32 and 34. The horizontal axis denotes the thickness of the first and second AlN layers 32 and 34, and the vertical axis denotes the nitrogen-source flow ratio in the thickness direction.

Referring to FIG. 6, the nitrogen-source flow ratio in a thickness of 0 to d1 is 0.5. That is the first flow ratio, which is the nitrogen-source flow ratio used for growing the first AlN layer 32, is constant. The nitrogen-source flow ratio in thickness of d1 to (d1+d2) is 0.005, which is lower than 0.5. That is, the second flow ratio, which is the nitrogen-source flow ratio used for growing the second AlN layer 34, is constant and is lower than the first flow ratio. By growing the first AlN layer 32 and the second AlN layer 34 with the respective constant flow ratios, the growth rate is stabilized, and the crystal quality and surface morphology are improved.

As described above, the first embodiment uses MOVPE and sets the nitrogen-source flow ratio at the far side from the Si substrate 12 lower than that at the near side in the processes of growing the first AlN layer 32 and the second AlN layer 34. The first AlN layer 32 is grown on the Si substrate 12 by setting the nitrogen-source flow ratio to the first flow ratio, and the second AlN layer 34 is grown on the first AlN layer 32 by setting the nitrogen-source flow ratio to the second flow ratio that is lower than the first flow ratio. Then, the GaN-based semiconductor layer is formed on the second AlN layer 34. Thus, the interface between the Si substrate 12 and the first AlN layer 32 has high resistance. Since the second AlN layer 34 is formed on the first AlN layer 32 having good surface morphology, the second AlN layer 34 may be grown evenly. Since the GaN-based semiconductor layer is grown on the even surface of the second AlN layer 34, the GaN-based semiconductor layer can be grown evenly.

In the above description of the first embodiment, the first flow ratio is set equal to 0.5, and the second flow ratio is set equal to 0.005. In order to obtain the above-described effects, the second flow ratio is preferably equal to or lower than 1/50 of the first flow ratio, and is more preferably equal to or lower than 1/100. The first flow ratio is preferably equal to 0.05 to 1, and is more preferably equal to 0.1 to 0.5. By growing the first AlN layer 32 with the above nitrogen-source flow ratio, good surface morphology is obtained. The second flow ratio is preferably equal to 0.0001 to 0.1, and is more preferably equal to 0.001 to 0.01. The second AlN layer 34 is evenly grown with the above nitrogen-source flow ratio.

In the above description of the first embodiment, the growth pressure used in growing the first AlN layer 32 is set equal to $1.33 \times 10^4$ Pa, and the growth pressure used in growing the second AlN layer 34 is set equal to $1.00 \times 10^4$ Pa. It is preferable that the growth pressure used in growing the first AlN layer 32 is higher than that used in growing the second AlN layer 34. By reducing the $NH_3$ flow ratio, the second AlN 34 may further be improved to have better surface morphology and use lower growth pressure.

In the above description of the first embodiment, the thickness d1 of the first AlN layer 32 is 20 nm, and the thickness d2 of the second AlN layer 34 is 230 nm. It is preferable that the first AlN layer 32 is thinner than the second AlN layer 34. If the first AlN layer 32 is excessively thick, the surface morphology deteriorates, and the crystal quality may become worse. With the above in mind, the thickness d1 of the first AlN layer 32 is desirably equal to or less than 50 nm, and is preferably equal to or less than 20 nm. In a case where the first AlN layer 32 is 20 nm thick or less, high resistance and less ruggedness are realized. Further, the crystal quality is improved as illustrated in FIG. 3. In the case where the Si substrate 12 is used, it is preferable that the thickness of the first AlN layer 32 is equal to or more than 5 nm because the Si substrate 12 easily reacts on Ga.

The Si substrate 12 used in the above-described first embodiment may be replaced with a substance other than nitride, which may, for example, be sapphire, gallium oxide ($Ga2O3$), zinc oxide (ZnO).

The above-described first embodiment employs gases of TMAl and NH3 used in growing the first AlN layer 32 and the second AlN layer 34. The source material of aluminum in the step of foming the AlN layer is not limited to TMAl but may be TEAl (triethylaluminum). The source material of nitrogen, namely, nitrogen source may be $C_2H_8N_2$ (dimethylhydrazine) or nitrogen radical.

The above-described first embodiment employs gases of TMAl, TMGa, NH3 used in growing the AlGaN layer 16. TEGa may be substituted for TMAl. The TMGa may be replaced by TEAl. The nitrogen source may be $C_2H_8N_2$ or nitrogen radical.

Second Embodiment

A second embodiment is now described.

The second embodiment differs from the firs embodiment in the way of changing the nitrogen-source flow ratio in the processes of growing the first AlN layer 32 and the second AlN layer 34. The way used in the second embodiment gradually decreases the nitrogen-source flow ratio. This way may be carried out by changing the setting of the growth equipment or growth condition.

Figure 7:
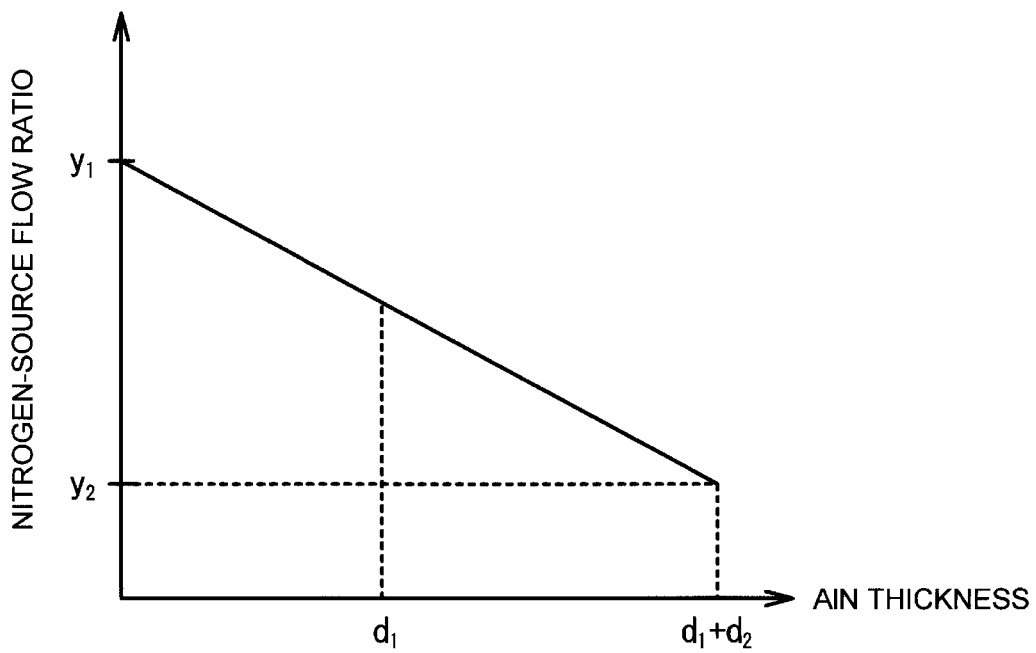
FIG. 7 is a graph that illustrates a change of the nitrogen-source flow ratio in the thickness direction with respect to a change in the thickness of an AlN layer in a second embodiment.

FIG. 7 is a graph that illustrates a change of the nitrogen-source flow ratio in the thickness direction with respect to a change in the thickness of the first and second AlN layers 32 and 34. The horizontal and vertical axes of FIG. 7 are the same as those of FIG. 6.

Referring to FIG. 7, the nitrogen-source flow ratio gradually decreases from y1 to y2 in the range of 0 to (d1 and d2). That is, the nitrogen-source flow ratio used in growing the first AlN layer 32 is gradually decreased from the interface with the Si substrate 12 to the interface with the second AlN layer 34. The nitrogen-source flow ratio used in growing the second AlN layer 34 is gradually decreased from the interface with the first AlN layer 32 to the interface with the AlGaN layer 16.

Third Embodiment

A third embodiment is now described.

The third embodiment differs from the first and second embodiments in the way of changing the nitrogen-source flow ratio in the processes of growing the first AlN layer 32 and the second AlN layer 34. The third embodiment is configured to gradually change the nitrogen-source flow ratio in the process of growing the second AlN layer 34 having the thickness d2. Thus, in the process of d3, it is possible to suppress instantaneous and abrupt variation in the growth pressure and growth temperature, which tends to occur in response to an abrupt change of the nitrogen-source flow ratio. It is thus possible to realize substantially stable growth environment (such as growth temperature and growth condition) and improve the crystal quality and surface morphology.

Figure 8:
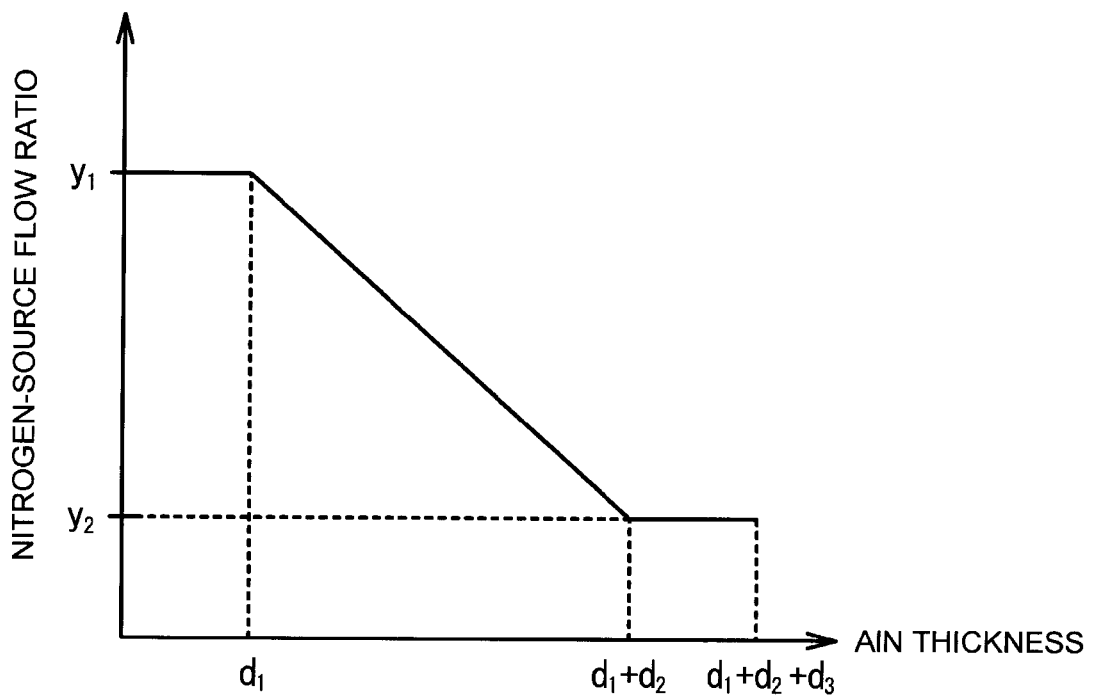
FIG. 8 is a graph that illustrates a change of the nitrogen-source flow ratio in the thickness direction with respect to a change in the thickness of an AlN layer in a third embodiment.

FIG. 8 is a graph that illustrates a change of the nitrogen-source flow ratio in the thickness direction with respect to a change in the thickness of the first and second AlN layers 32 and 34. The horizontal and vertical axes of FIG. 8 are the same as those of FIG. 6.

Referring to FIG. 8, the nitrogen-source flow ratio used to form the thickness d1 from zero is constant and is y1. The nitrogen-source flow ratio used to form the thickness d2 from d1 is gradually decreased. The nitrogen-source flow ratio used to form the thickness d3 from (d1+d2) is constant and is y2. By changing the nitrogen-source flow ratio as illustrated in FIG. 8, the method sequentially grows the first AlN layer having the thickness d1, the second AlN layer having the thickness d2, and the third AlN layer having the thickness d3.

It is to be noted that the ways of changing the nitrogen-source flow ratio in growing the first AlN layer 32 and the second AlN layer 34 are just examples. Another changing way may be employed as long as the nitrogen-source flow ratio at the far side from the Si substrate 12 is set lower than that at the near side.

The present invention is not limited to the specifically described embodiments and variations, but may include other embodiments and variations without departing from the scope of the present invention.

What is claimed is:

1. A method for fabricating a semiconductor device comprising:
    growing an AlN layer by MOVPE in which a nitrogen-source flow ratio at a far side from a substrate is set lower than that at a near side, the nitrogen-source flow ratio being a ratio of a flow rate of a nitrogen source to a total flow rate of growth gas; and
    growing a GaN-based semiconductor layer on the AlN layer by MOVPE.

2. The method according to claim 1, wherein the growing of the AlN layer includes:
    growing a first AlN layer on the substrate so that the nitrogen-source flow ratio is set to a first flow ratio; and
    growing a second AlN layer on the first AlN layer so that the nitrogen-source flow ratio is set to a second flow ratio lower than the first flow ratio.

3. The method according to claim 2, wherein the first flow ratio is equal to or greater than 0.05.

4. The method according to claim 2, wherein the first AlN layer is grown at a growth pressure higher than that at which the second AlN layer is grown.

5. The method according to claim 2, wherein the first AlN layer is thinner than the second AlN layer.

6. The method according to claim 2, wherein the first AlN layer has a thickness equal to or less than 50 nm.

7. The method according to claim 1, wherein the nitrogen-source flow ratio used in growing the AlN layer is gradually decreased from an interface between the substrate and the AlN layer to another interface between the AlN layer and the GaN-based layer.

8. The method according to claim 1, wherein the growing of the AlN layer includes;
    growing a first AlN layer on the substrate so that the nitrogen-source flow ratio is set to a first flow ratio;
    growing a second AlN layer on the first AlN layer so that the nitrogen-source flow ratio is gradually decreased to a second flow ratio from the first flow ratio from an interface with the first AlN layer to another interface with a third AlN layer; and
    growing the third AlN layer on the second AlN layer so that the nitrogen-source flow ratio is set to the second flow ratio.

9. The method according to claim 1, wherein the growing of the AlN layer uses a source material of aluminum that is one of trimethylaluminum and triethylaluminum, and a source material of nitrogen that is one of ammonia, dimethylhydrazine and nitrogen radical.

10. The method according to claim 2, wherein the growing of the AlN layer uses a source material of aluminum that is one of trimethylaluminum and triethylaluminum, and a source material of nitrogen that is one of ammonia, dimethylhydrazine and nitrogen radical.

* * * * *